(12) United States Patent  
Su et al.

(10) Patent No.: US 11,532,750 B2  
(45) Date of Patent: Dec. 20, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Li-Li Su, Chubei (TW); Wei-Min Liu, Hsinchu (TW); Wei Hao Lu, Taoyuan (TW); Chien-I Kuo, Zhubei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/941,427

(22) Filed: Jul. 28, 2020

(65) Prior Publication Data

US 2021/0273102 A1 Sep. 2, 2021

Related U.S. Application Data

(60) Provisional application No. 62/982,427, filed on Feb. 27, 2020.

(51) Int. Cl.
*H01L 29/78* (2006.01)
*H01L 29/66* (2006.01)
*H01L 21/8234* (2006.01)

(52) U.S. Cl.
CPC .. *H01L 29/7851* (2013.01); *H01L 21/823431* (2013.01); *H01L 21/823468* (2013.01); *H01L 29/66803* (2013.01)

(58) Field of Classification Search
CPC ..... H01L 21/823431; H01L 21/823814; H01L 21/823418; H01L 27/0886; H01L 27/1211; H01L 29/66795; H01L 29/785–7851; H01L 29/41791; H01L 29/66545; H01L 29/0856–0886; H01L 29/66636

See application file for complete search history.

(56) References Cited

U.S. PATENT DOCUMENTS

| 8,785,285 B2 * | 7/2014 | Tsai ................. H01L 29/45 257/E21.409 |
| 10,269,655 B1 * | 4/2019 | Lee ................... H01L 27/0924 |
| 2015/0179795 A1 * | 6/2015 | Kim ................... H01L 29/7833 257/408 |
| 2018/0083109 A1 * | 3/2018 | Yu .................... H01L 29/66795 |
| 2018/0175172 A1 * | 6/2018 | Chang ................. H01L 29/267 |
| 2018/0286961 A1 * | 10/2018 | Bao .................. H01L 21/02639 |

(Continued)

FOREIGN PATENT DOCUMENTS

CN 105932060 A * 9/2016 ..... H01L 21/823821

*Primary Examiner* — Errol V Fernandes  
*Assistant Examiner* — Jeremy J Joy  
(74) *Attorney, Agent, or Firm* — Slater Matsil, LLP

(57) ABSTRACT

A device includes a fin extending from a substrate; a gate stack over and along sidewalls of the fin; a gate spacer along a sidewall of the gate stack; an epitaxial source/drain region in the fin and adjacent the gate spacer, the epitaxial source/drain region including a first epitaxial layer on the fin, the first epitaxial layer including silicon and arsenic; and a second epitaxial layer on the first epitaxial layer, the second epitaxial layer including silicon and phosphorus, the first epitaxial layer separating the second epitaxial layer from the fin; and a contact plug on the second epitaxial layer.

20 Claims, 20 Drawing Sheets

(56) References Cited

U.S. PATENT DOCUMENTS

| | | | |
|---|---|---|---|
| 2019/0006507 A1* | 1/2019 | Ma | H01L 21/823418 |
| 2019/0148492 A1* | 5/2019 | Yong | H01L 29/7848 |
| | | | 257/401 |
| 2019/0148556 A1* | 5/2019 | Wang | H01L 21/76897 |
| | | | 257/365 |
| 2019/0165100 A1* | 5/2019 | Kuo | H01L 29/7851 |
| 2019/0267471 A1* | 8/2019 | Chan | H01L 27/0924 |
| 2020/0044045 A1* | 2/2020 | Wang | H01L 29/66439 |
| 2020/0168742 A1* | 5/2020 | Wang | H01L 21/30604 |
| 2020/0303521 A1* | 9/2020 | Son | H01L 29/66439 |
| 2020/0312958 A1* | 10/2020 | Murthy | H01L 29/456 |

* cited by examiner

SEMICONDUCTOR DEVICE AND METHOD OF MANUFACTURE

PRIORITY CLAIM AND CROSS-REFERENCE

This application claims the benefit of U.S. Provisional Application No. 62/982,427, filed on Feb. 27, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
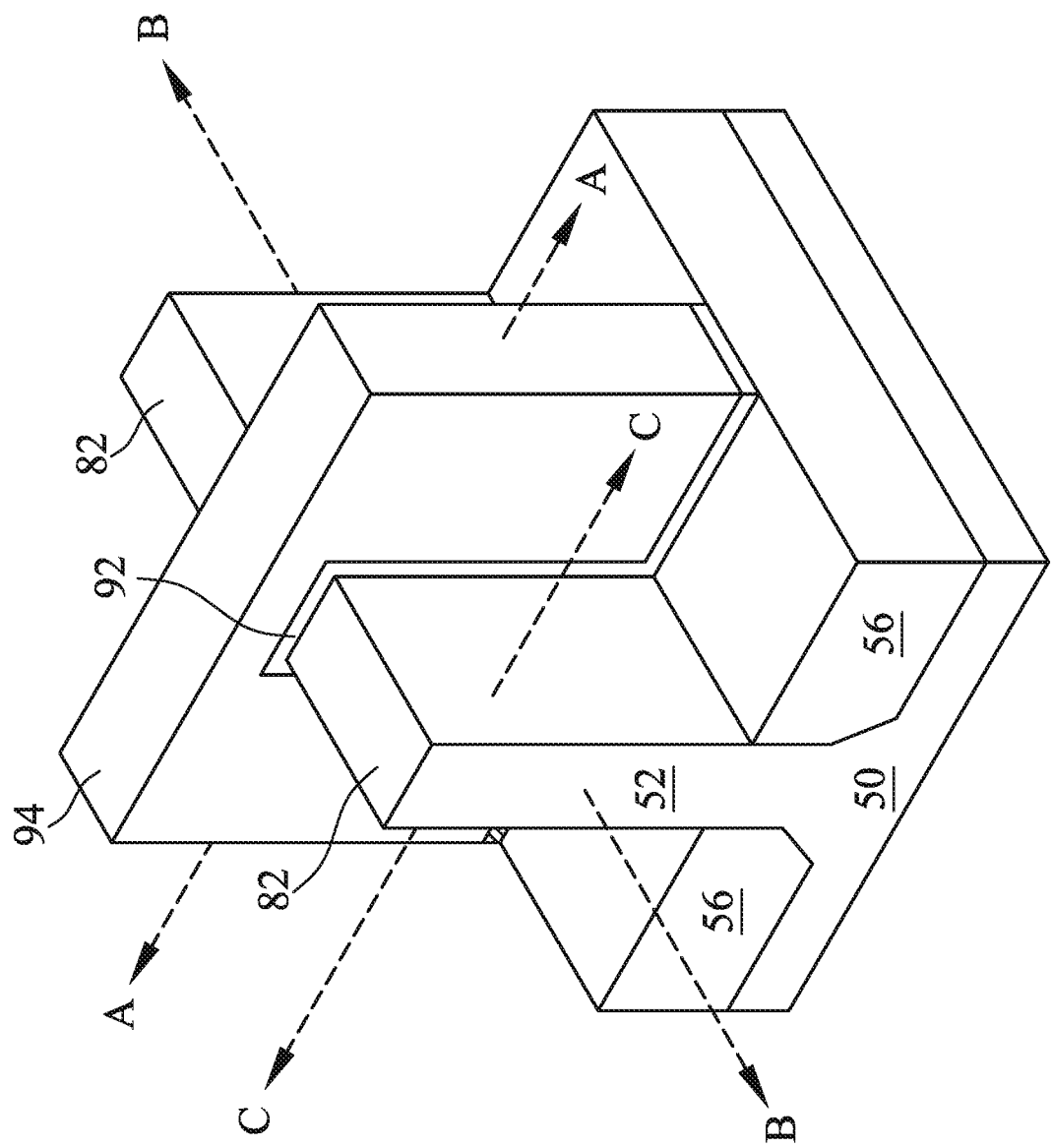
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are discussed herein in a particular context, namely, forming epitaxial source/drain regions in an n-type FinFET transistor. However, various embodiments may be applied to other semiconductor devices/processes, such as planar transistors or nanostructure transistors. In some embodiments, the epitaxial source/drain regions described herein includes a bottom layer doped with arsenic. The presence of arsenic in the bottom layer can block other dopants (e.g., phosphorus) from diffusing into other regions of the FinFET. The arsenic-doped bottom layer can also allow for a more abrupt junction at the epitaxial source/drain regions, which can reduce unwanted effects such as drain-induced barrier lowering (DIBL). By decreasing the thickness of the arsenic-doped bottom layer, the resistance of the epitaxial source/drain regions can be reduced.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

Figure 16B:
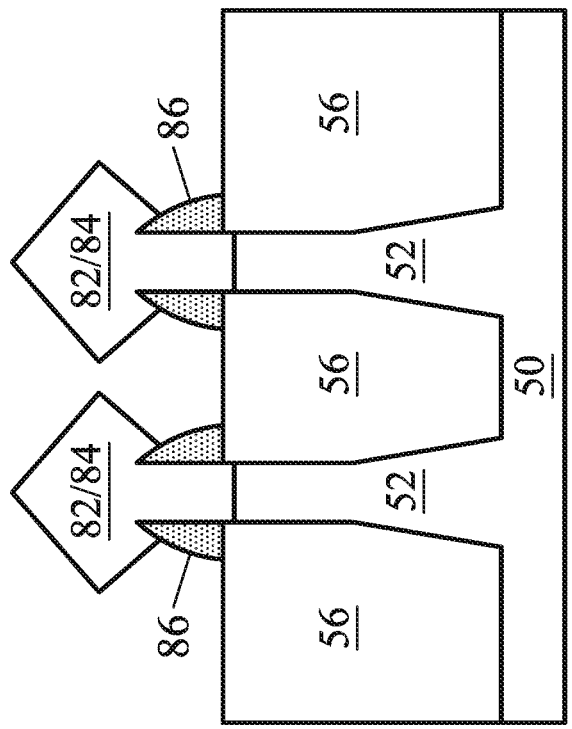
FIGS. 16A, 16B, 17A, 17B, 18A, 18B, 19A, 19B, 20A, 20B, 20C, 21A, 21B, 22A, and 22B are cross-sectional views of intermediate stages in the manufacturing of FinFETs, in accordance with some embodiments.
Figure 16A:
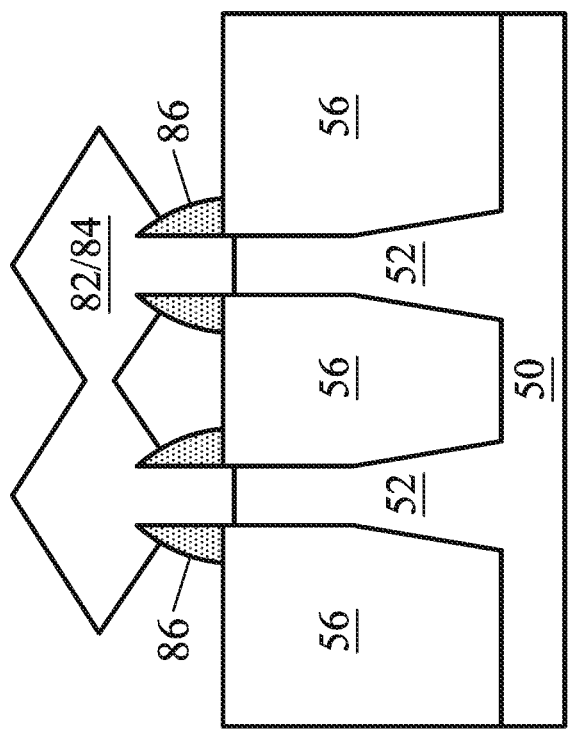

FIGS. 2 through 12 and 16A through 22B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 17A, 18A, 19A, 20A, 21A, and 22A are illustrated along reference cross-section A-A illustrated in FIG. 1, and FIGS. 8B, 9B, 10, 11, 12, 17B, 18B, 19B, 19C, 20B, 21B, and 22B are illustrated along a similar cross-section B-B illustrated in FIG. 1, except for multiple fins/FinFETs. FIGS. 16A and 16B are illustrated along reference cross-section C-C illustrated in FIG. 1, except for multiple fins/FinFETs.

Figure 2:
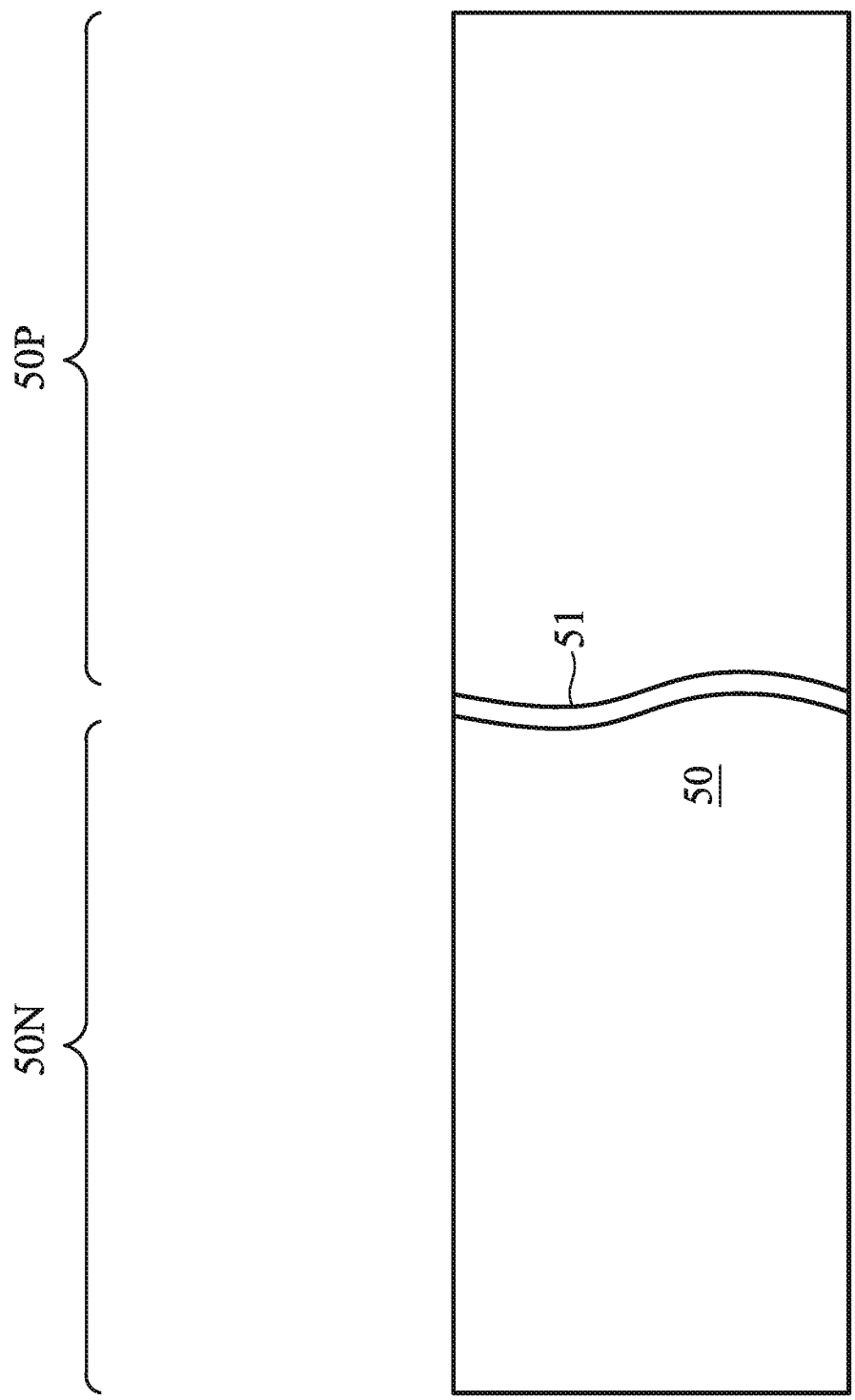
FIGS. 2, 3, 4, 5, 6, 7, 8A, 8B, 9A, 9B, 10, 11, and 12 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
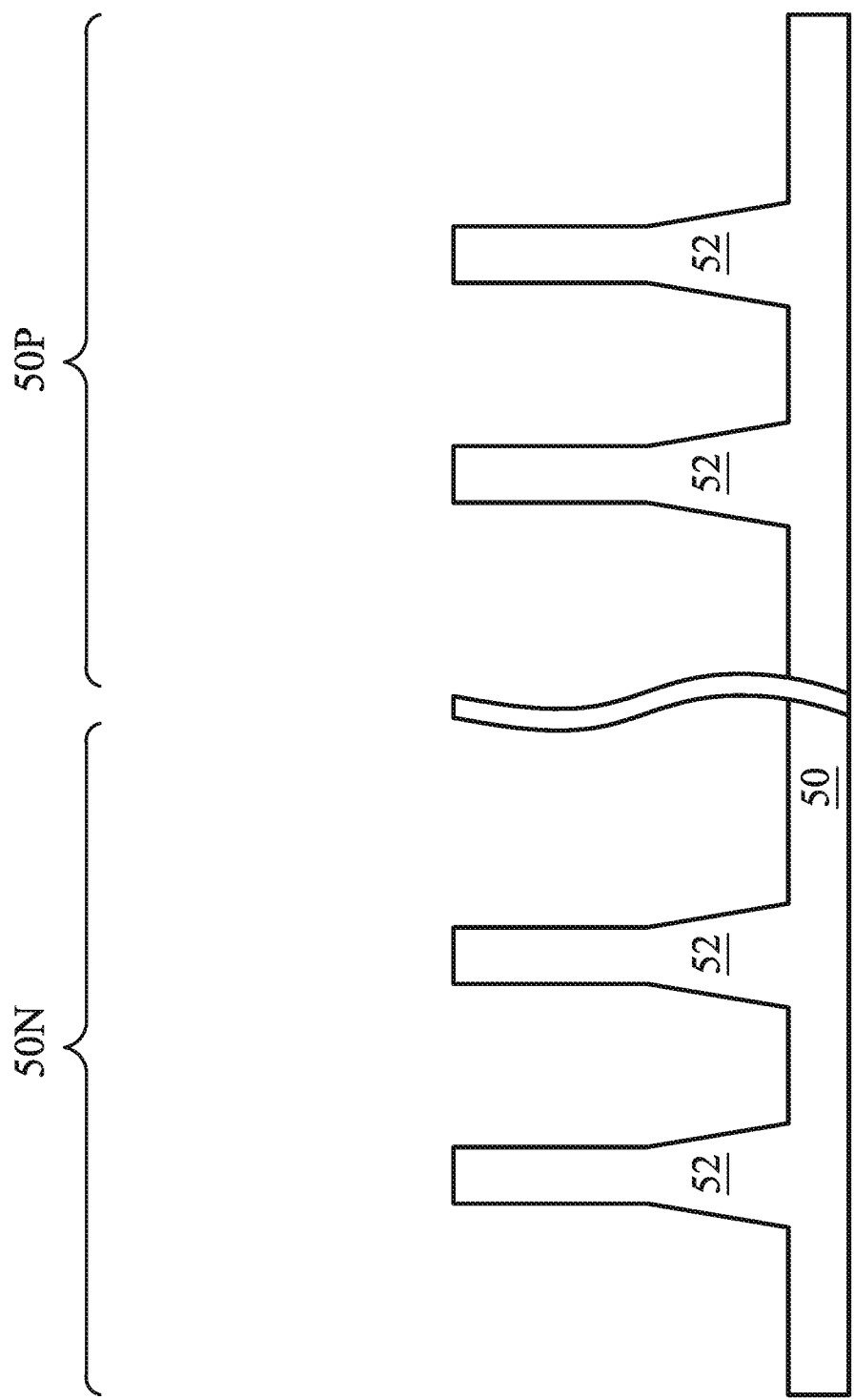

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
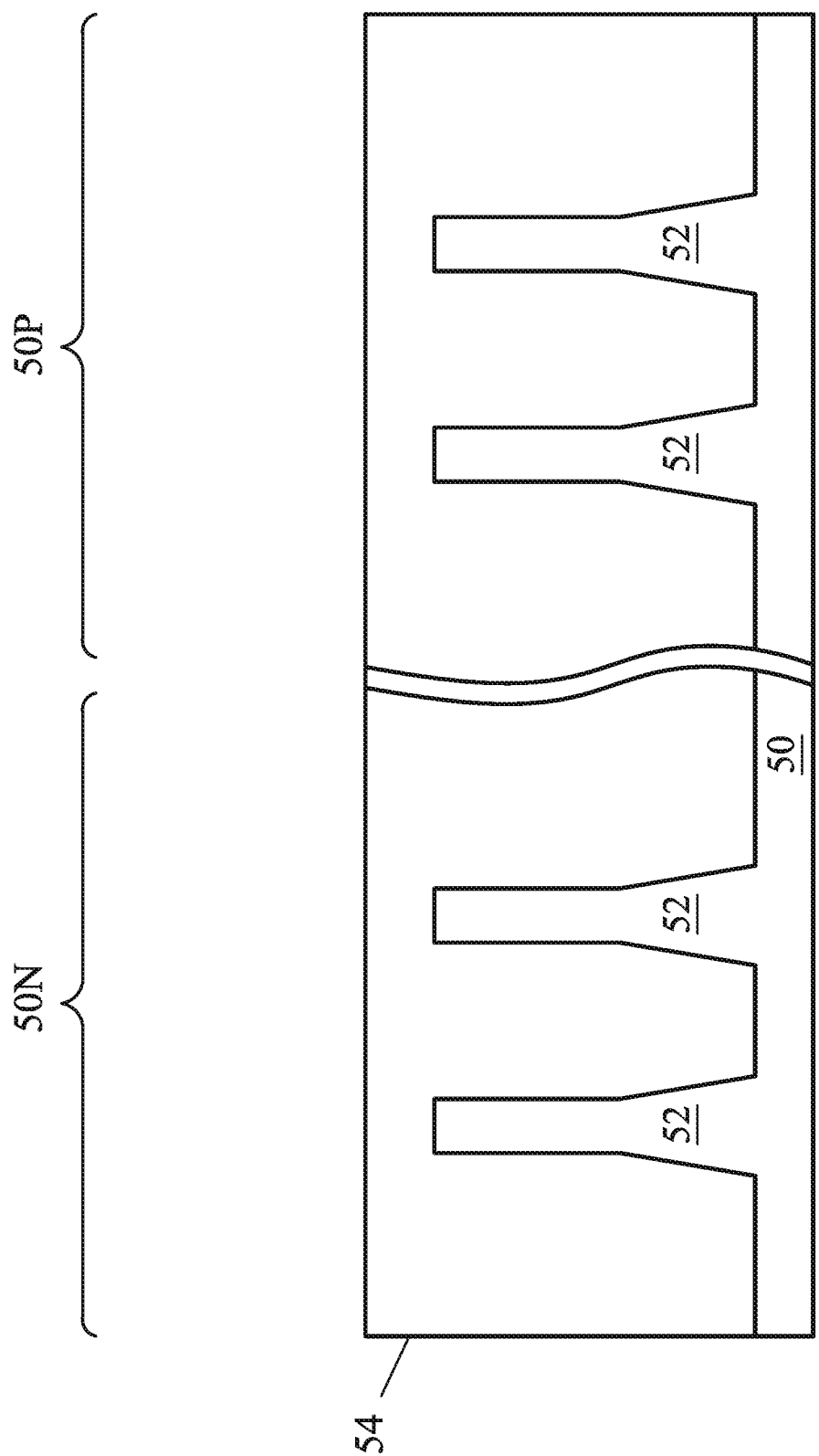

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
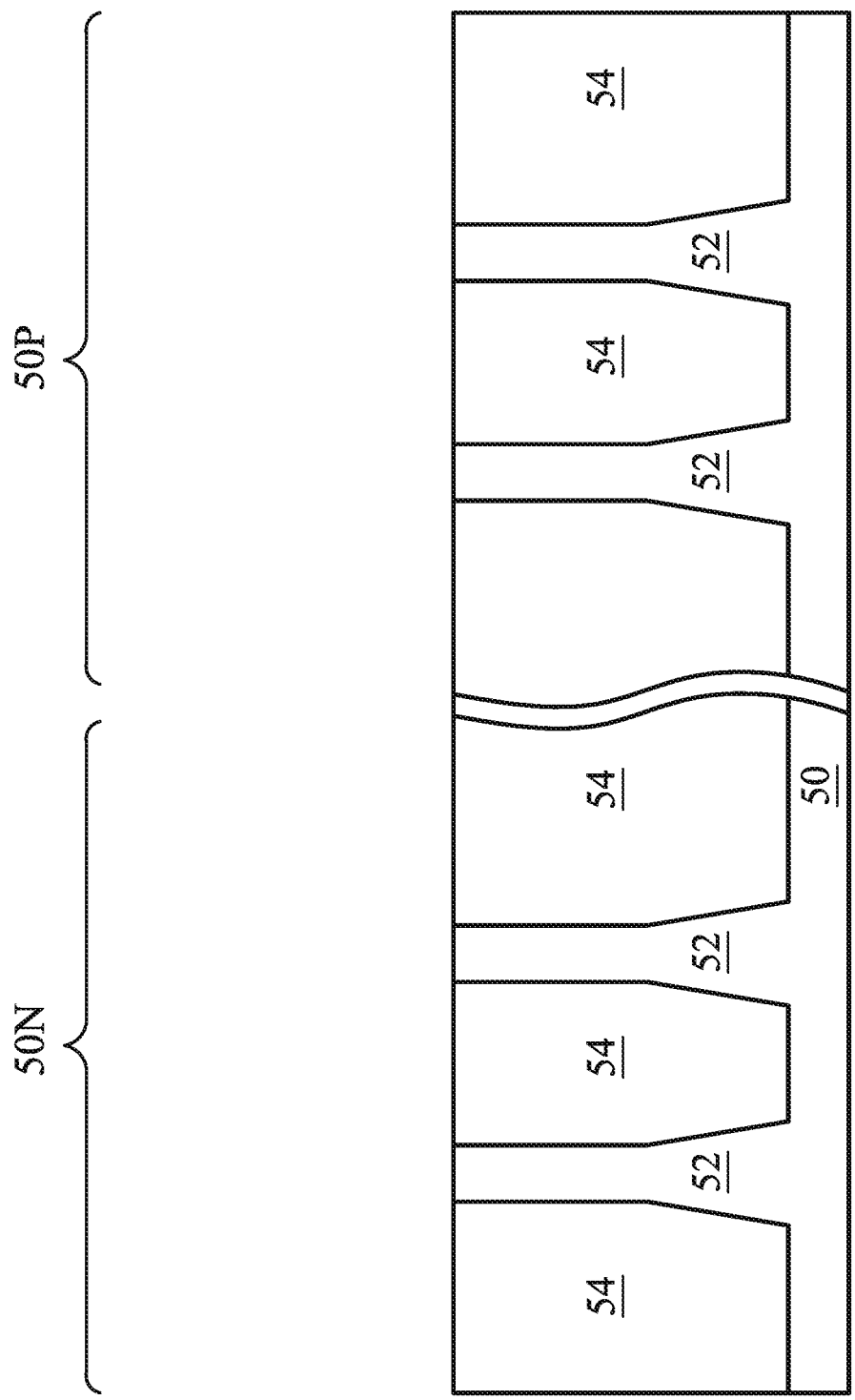

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
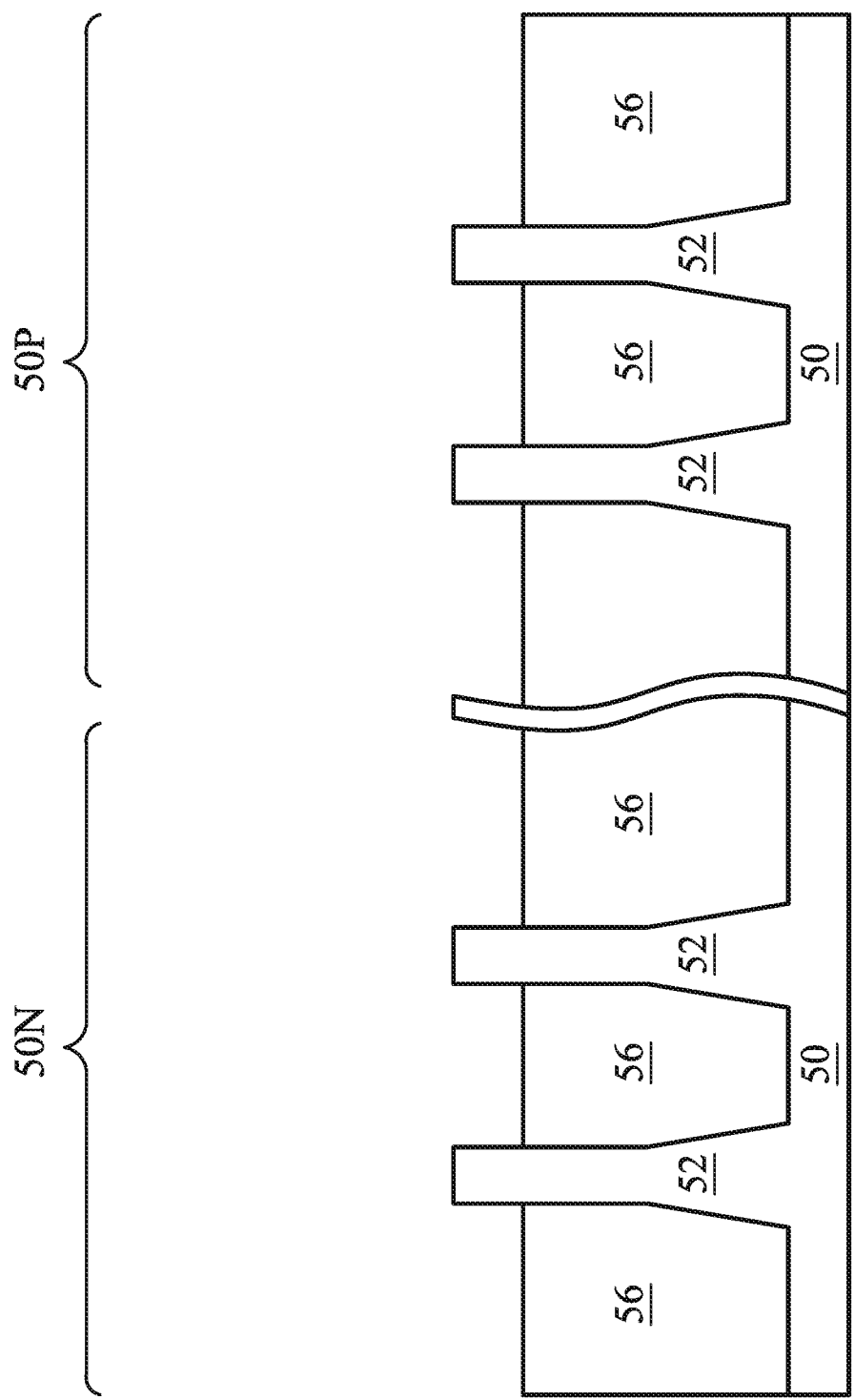

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
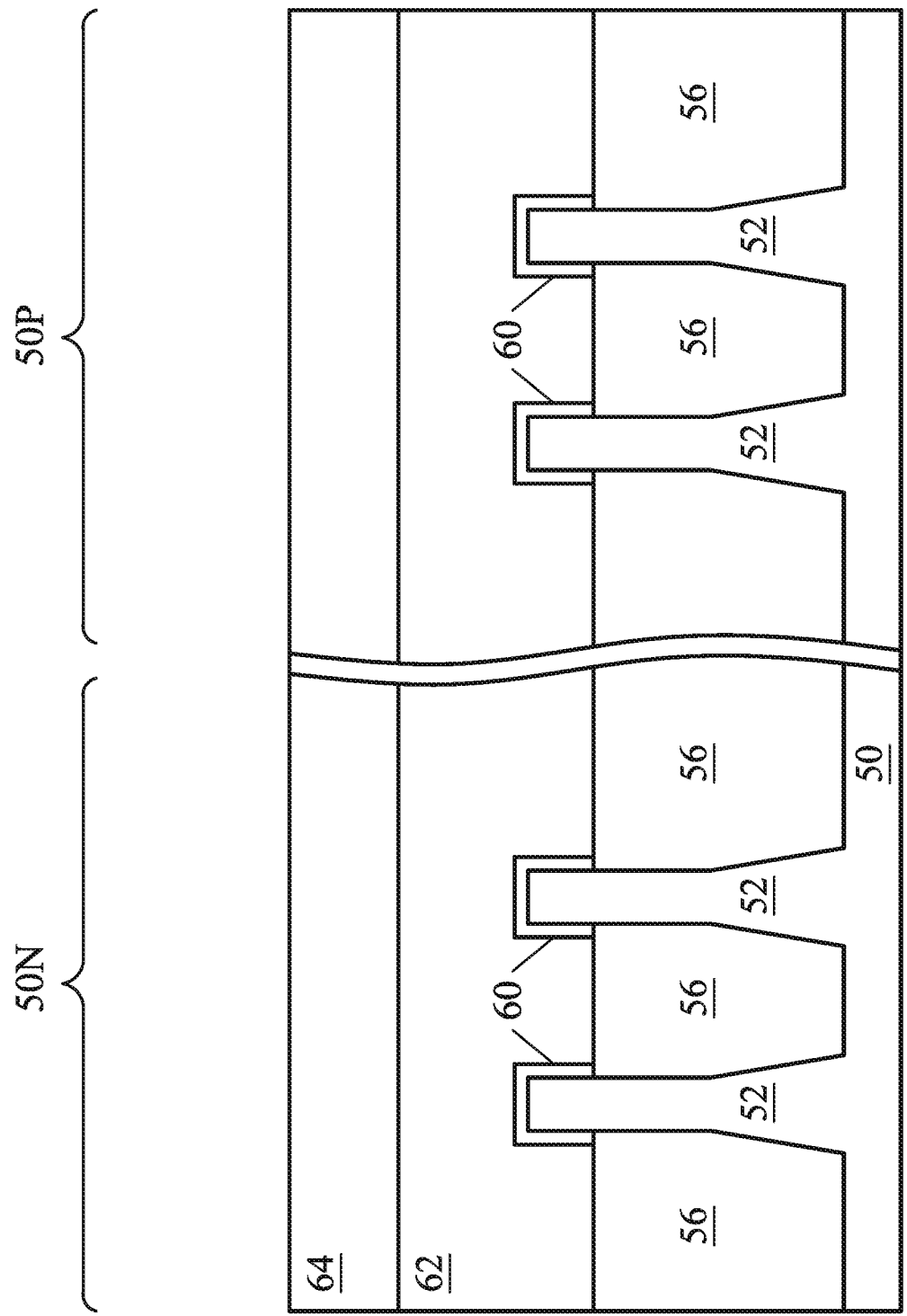

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8B:
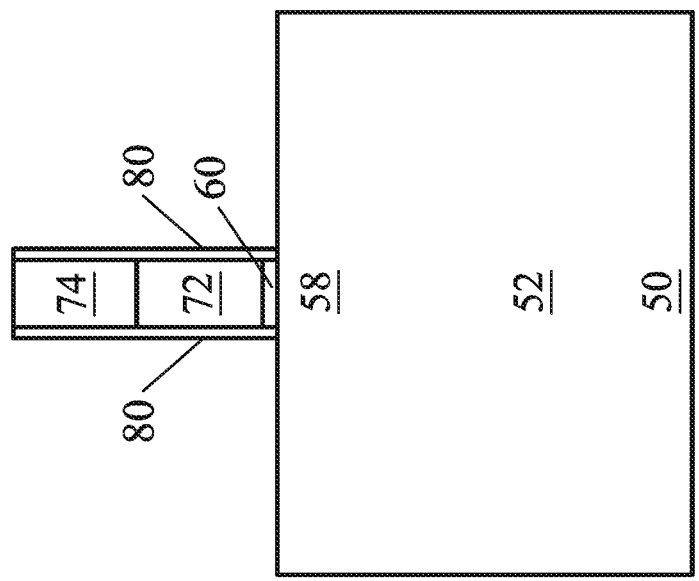
Figure 8A:
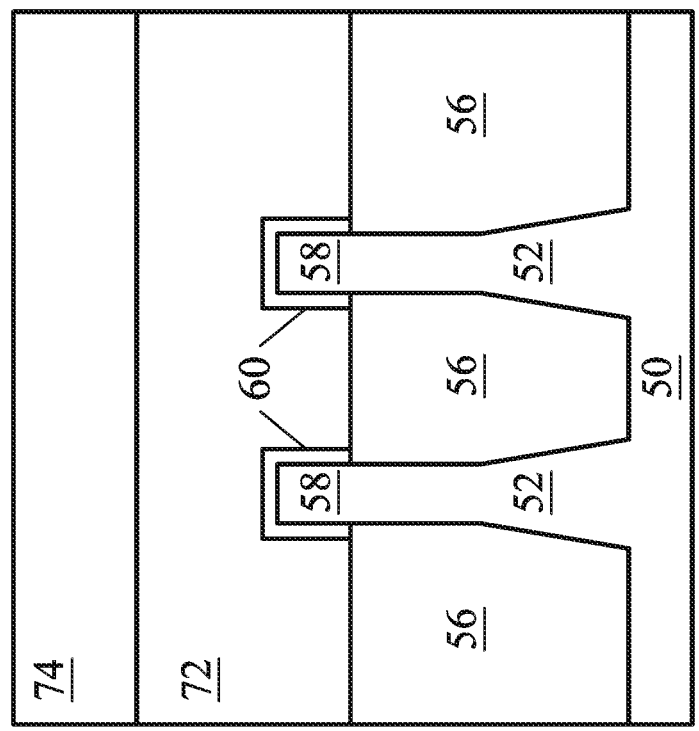

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
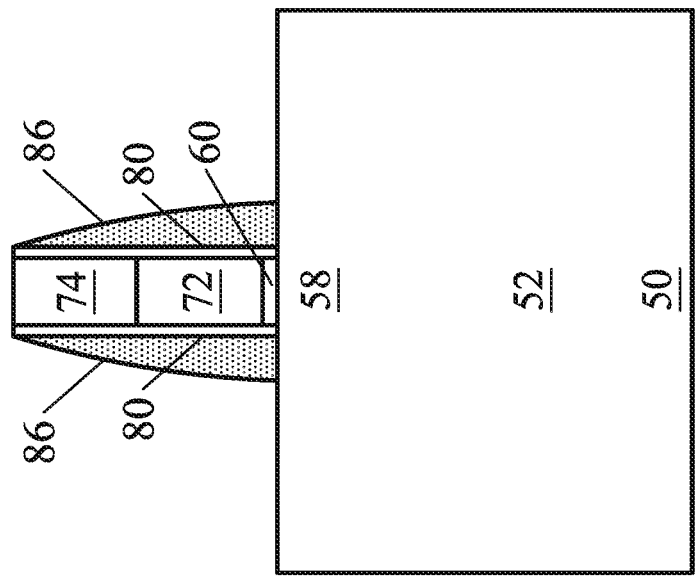
Figure 9A:
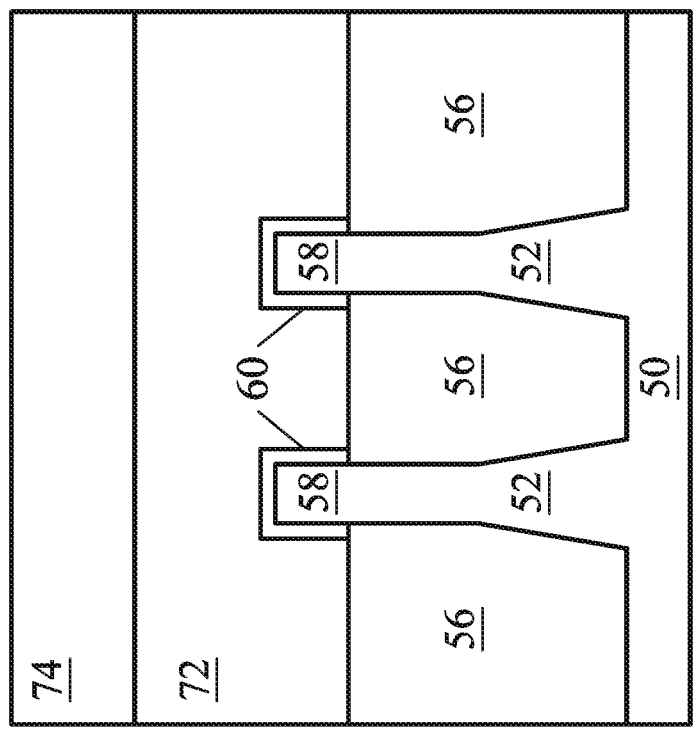

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 11:
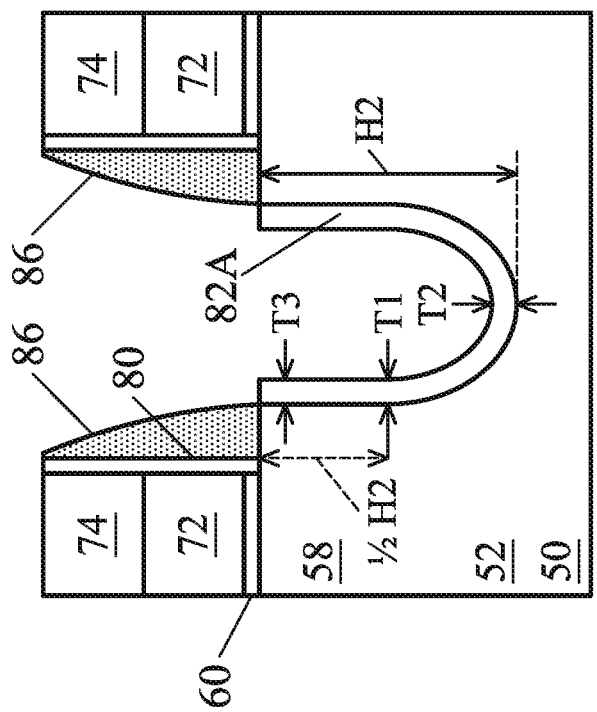
Figure 10:
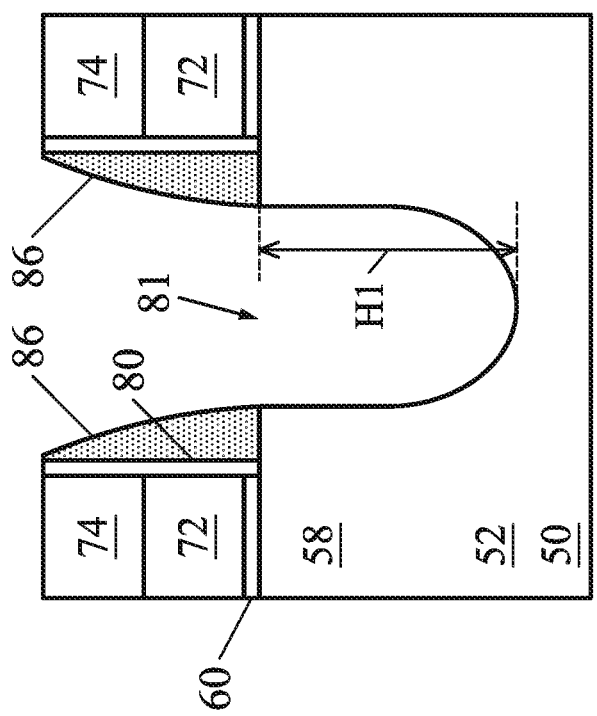
Figure 12:
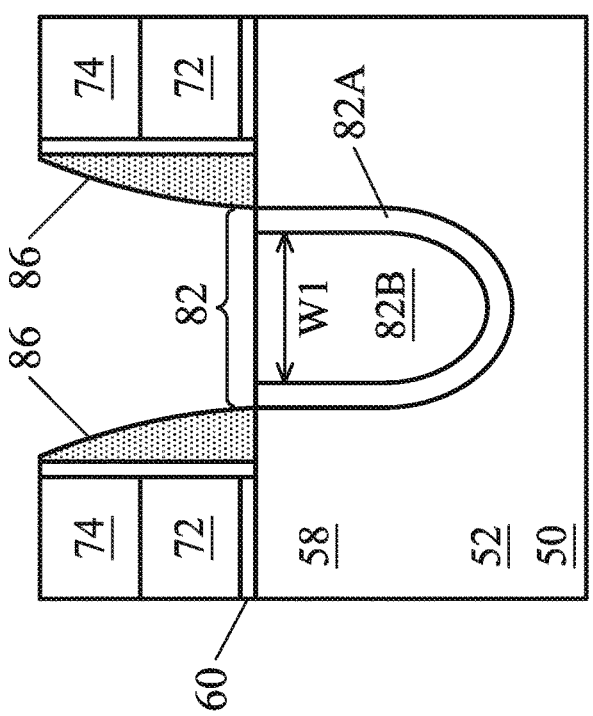

In FIGS. 10 through 12, epitaxial source/drain regions are formed in the fins 52, in accordance with some embodiments. FIGS. 10-12 are illustrated along reference cross-section B-B, and show the formation of an epitaxial source/drain region 82 (see FIG. 12) in a fin 52 in the n-type region 50N. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. Material(s) of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses 81 in the fins 52. Then, the epitaxial source/drain regions 82 in the n-type region 50N are epitaxially grown in the recesses 81, described below for FIGS. 11-12. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorus doped silicon carbide, silicon phosphide, or the like.

In some embodiments, the epitaxial source/drain regions 82 are formed from multiple epitaxial layers. For example, the epitaxial source/drain region 82 illustrated in FIGS. 11-12 includes a first epitaxial layer 82A and a second epitaxial layer 82B, which may be collectively referred to herein as the epitaxial source/drain region 82. In some embodiments, the different epitaxial layers of an epitaxial source/drain region 82 may have different compositions of semiconductor materials, different dopants or combinations of dopants, or have different concentrations of one or more dopants. The compositional transition between different epitaxial layers of the epitaxial source/drain regions 82 may be abrupt or gradual. In some embodiments, an anneal process may be performed after the epitaxial source/drain regions 82 are formed. In some embodiments, an anneal process may be performed during formation of the epitaxial source/drain regions 82, for example, after the growth of an epitaxial layer of an epitaxial source/drain region 82. The epitaxial source/drain regions 82 are shown having a substantially flat surface in the figures, but the epitaxial source/drain regions 82 may be formed having surfaces raised from respective surfaces of the fins 52 and may have facets.

Referring first to FIG. 10, a patterning process is performed on the fins 52 to form recesses 81 in source/drain regions of the fins 52. The patterning process may be performed in a manner that the recesses 81 are formed between neighboring dummy gates 72 (e.g., in interior regions of the fins 52), or between an isolation region 56 and adjacent dummy gates 72 (e.g., in end regions of the fins 52). In some embodiments, the patterning process may include a suitable anisotropic dry etching process, while using the dummy gates 72, the gate spacers 86, and/or isolation regions 56 as a combined mask. The suitable anisotropic dry etching process may include a reactive ion etch (RIE), a neutral beam etch (NBE), the like, or a combination thereof. In some embodiments where the RIE is used in the patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and thus increase a rate of physical etching. In some embodiments, the anisotropic etching process may be performed using a process gas mixture including $CH_3F$, $CH_4$, HBr, $O_2$, Ar, the like, or a combination thereof. In some embodiments, the patterning process forms recesses 81 having U-shaped or round bottom surfaces, such as shown in FIG. 10. In some embodiments, the recesses 81 may be formed having a vertical depth H1 that is between about 20 nm and about 100 nm from the top surface of the fins 52.

Turning to FIG. 11, the first epitaxial layer 82A of the epitaxial source/drain region 82 is formed, in accordance with some embodiments. In some embodiments, the first epitaxial layer 82A is silicon, and may include other semiconductor materials such as germanium. The first epitaxial layer 82A may include dopants such as arsenic, or phosphorus, other n-type dopants, other dopants, the like, or combinations thereof. For example, the first epitaxial layer 82A may be silicon doped with an atomic concentration of arsenic that is between about 1E20 cm$^{-3}$ and about 2E21 cm$^{-3}$, though other concentrations of arsenic or other dopants are possible. In some cases, the first epitaxial layer 82A is grown without explicitly incorporating a dopant species of the second epitaxial layer 82B, though that dopant species may subsequently diffuse into the first epitaxial layer 82A.

The first epitaxial layer 82A may be grown using a suitable process, such as chemical vapor deposition (CVD) or the like. For example, a first epitaxial layer 82A comprising arsenic-doped silicon may be formed using a CVD process with tricholorsilane (SiHCl$_3$), dichlorosilane (SiH$_2$Cl$_2$), silane (SiH$_4$), Si$_2$H$_6$, Si$_3$H$_8$, the like, or a combination thereof as silicon precursors; with tertiarybutylarsine (C$_4$H$_{11}$As), AsH$_3$, the like, or a combination thereof as arsenic precursors; or with HCl, Cl$_2$, the like, or a combination thereof as etchant precursors. These are examples, and other precursors are possible. In some embodiments, the precursors may be flowed into a deposition chamber at a flow rate between about 10 sccm and about 2000 sccm. In some embodiments, the first epitaxial layer 82A may be formed using a process temperature that is between about 600° C. and about 800° C., or may be formed using a process pressure that is between about 5 Torr and about 300 Torr. Other process conditions are possible.

The first epitaxial layer 82A may be grown as a layer covering the surfaces of the recess 81 (e.g., conformally). The surfaces of the first epitaxial layer 82A may be faceted or may be round, as shown in FIG. 11. As such, the bottom of the first epitaxial layer 82A may be a distance H2 from the top surface of the fins 52 that is between about 20 nm and about 100 nm, though other distances are possible. The distance H2 may be about the same as the vertical depth H1 of the recess 81. In some embodiments, the first epitaxial layer 82A has a sidewall thickness T1 that is between about 1 nm and about 6 nm, though other thicknesses are possible. As shown in FIG. 11, the sidewall thickness T1 may be measured at a distance at or near one-half of the distance H2 below the top surface of the fins 52 (e.g., at the midpoint of the distance H2). The first epitaxial layer 82A may have a bottom thickness T2 that is between about 1 nm and about 12 nm or a top thickness T3 that is between about 1 nm and about 6 nm, though other thicknesses are possible. In some cases, a smaller thickness (e.g., a smaller T1) may reduce the resistivity of the resulting epitaxial source/drain region 82, which can improve device performance.

Turning to FIG. 12, the second epitaxial layer 82B of the epitaxial source/drain region 82 is formed over the first epitaxial layer 81A, in accordance with some embodiments. In some embodiments, the second epitaxial layer 82B is silicon, and may include other semiconductor materials such as germanium. The second epitaxial layer 82B may include dopants such as arsenic, or phosphorus, other n-type dopants, other dopants, the like, or combinations thereof. For example, the second epitaxial layer 82B may be silicon doped with an atomic concentration of phosphorus that is between about 1E20 cm$^{-3}$ and about 5E21 cm$^{-3}$, though other concentrations of phosphorus or other dopants are possible. In some embodiments, the second epitaxial layer 82B is doped with different dopant species than the first epitaxial layer 82A. For example, in some embodiments the first epitaxial layer 82A is arsenic-doped silicon and the second epitaxial layer 82B is phosphorus-doped silicon, though other dopants or combinations of dopants are possible. In some cases, the second epitaxial layer 82B is grown without explicitly incorporating a dopant species of the first epitaxial layer 82A, though that dopant species may subsequently diffuse into the second epitaxial layer 82B.

The second epitaxial layer 82B may be grown using a suitable process, such as CVD or the like. The second epitaxial layer 82B may be grown in a separate process than the first epitaxial layer 82A or may be grown as part of a continuous process that also forms the first epitaxial layer 82A. For example, a second epitaxial layer 82B comprising phosphorus-doped silicon may be formed using a CVD process with tricholorsilane, dichlorosilane, silane, Si$_2$H$_6$, Si$_3$H$_8$, the like, or a combination thereof as silicon precursors; with P$_2$H$_6$, PCl$_3$, the like, or a combination thereof as phosphorus precursors; or with HCl, Cl$_2$, the like, or a combination thereof as etchant precursors. These are examples, and other precursors are possible. In some embodiments, the precursors may be flowed into a deposition chamber at a flow rate between about 10 sccm and about 2000 sccm. In some embodiments, the second epitaxial layer 82B may be formed using a process temperature that is between about 500° C. and about 800° C., or may be formed using a process pressure that is between about 5 Torr and about 300 Torr. Other process conditions are possible. In some embodiments, an anneal may be performed after the epitaxial source/drain regions 82 are formed.

Figure 13:
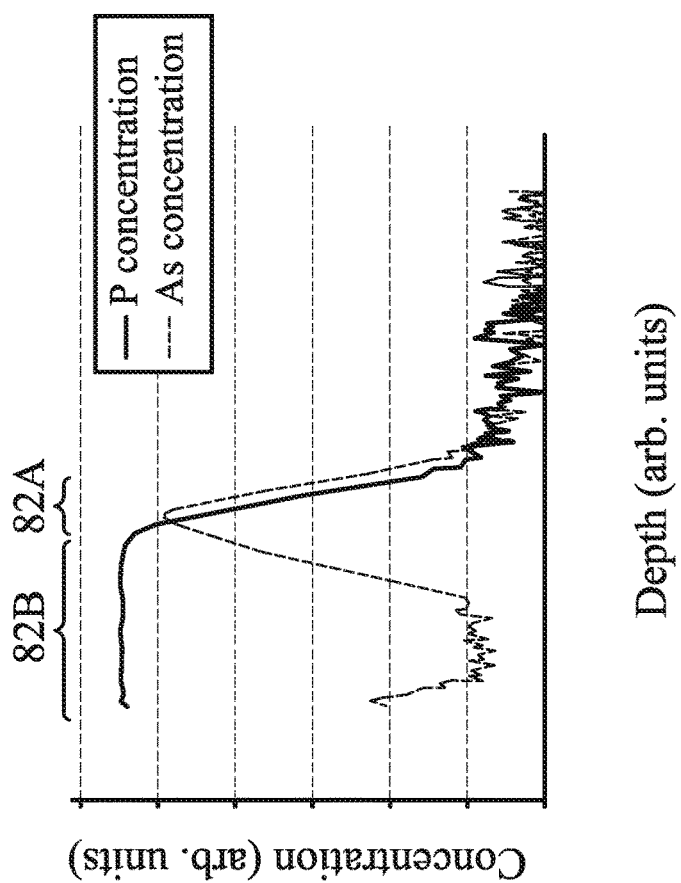
FIG. 13 is an illustration of a dopant profile of an epitaxial source/drain region of a FinFET, in accordance with some embodiments.

FIG. 13 is an illustration of example dopant concentration profiles of an epitaxial source/drain region 82, in accordance with some embodiments. FIG. 13 shows the concentrations of phosphorus and arsenic (logarithmic scale, arbitrary units) in a silicon epitaxial source/drain region 82 on the Y-axis and the depth (arbitrary units) into the epitaxial source/drain region 82 on the X-axis. Depths corresponding to the first epitaxial layer 82A and the second epitaxial layer 82B are also indicated in FIG. 13, though the indications of the epitaxial layers 82A-B are approximate and intended to be illustrative. In other embodiments, the epitaxial layers 82A-B may be at different depths or have different relative sizes. In some embodiments, the dopants may have different concentrations or different concentration profiles than shown, or different dopants than phosphorus and arsenic may be present.

Because arsenic atoms have a larger size than phosphorus atoms, arsenic atoms have less diffusivity than phosphorus atoms, and regions doped with arsenic can block diffusion of phosphorus atoms. In some cases, dopants (e.g., phosphorus) that diffuse from the epitaxial source/drain region 82 into the channel region 58 can degrade device performance, such as increasing drain-induced barrier lowering (DIBL), increasing undesired short-channel effects, or increasing parasitic capacitance. By acting as a barrier to diffusion, an arsenic-doped first epitaxial layer 82A can reduce diffusion of phosphorus atoms from a phosphorus-doped second epitaxial layer 82B into the channel region 58, and thus improve device performance. In some cases, an arsenic-doped first epitaxial layer 82A that has a greater thickness T1 can more effectively block diffusion from the second epitaxial layer 82B.

In some cases, because arsenic has less diffusivity than phosphorus, the use of an arsenic-doped first epitaxial layer 82A can allow for improved junction control between the epitaxial source/drain region 82 and the channel region 58. For example, the reduced diffusivity of arsenic may allow for the doping transition at an arsenic-doped region to be more abrupt than the doping transition at a phosphorus-doped region. In other words, the concentration gradient of arsenic at the edge of an arsenic-doped region may be shorter than the concentration gradient of phosphorus at the edge of a phosphorus-doped region. In this manner, the use of an arsenic-doped first epitaxial layer 82A at the interface between the epitaxial source/drain region 82 and the fins 52 may allow for a more abrupt doping transition between the source/drain region 82 and the channel region 58. Additionally, because arsenic can block the diffusion of phosphorus, the abruptness of the interface between the epitaxial source/drain region 82 and the channel region 58 may be primarily controlled by controlling the doping characteristics of the arsenic-doped first epitaxial layer 82A. In some cases, a shorter doping transition between the epitaxial source/drain region 82 and the channel region 58 may reduce the effects of DIBL, and thus can improve device performance.

Figure 14:
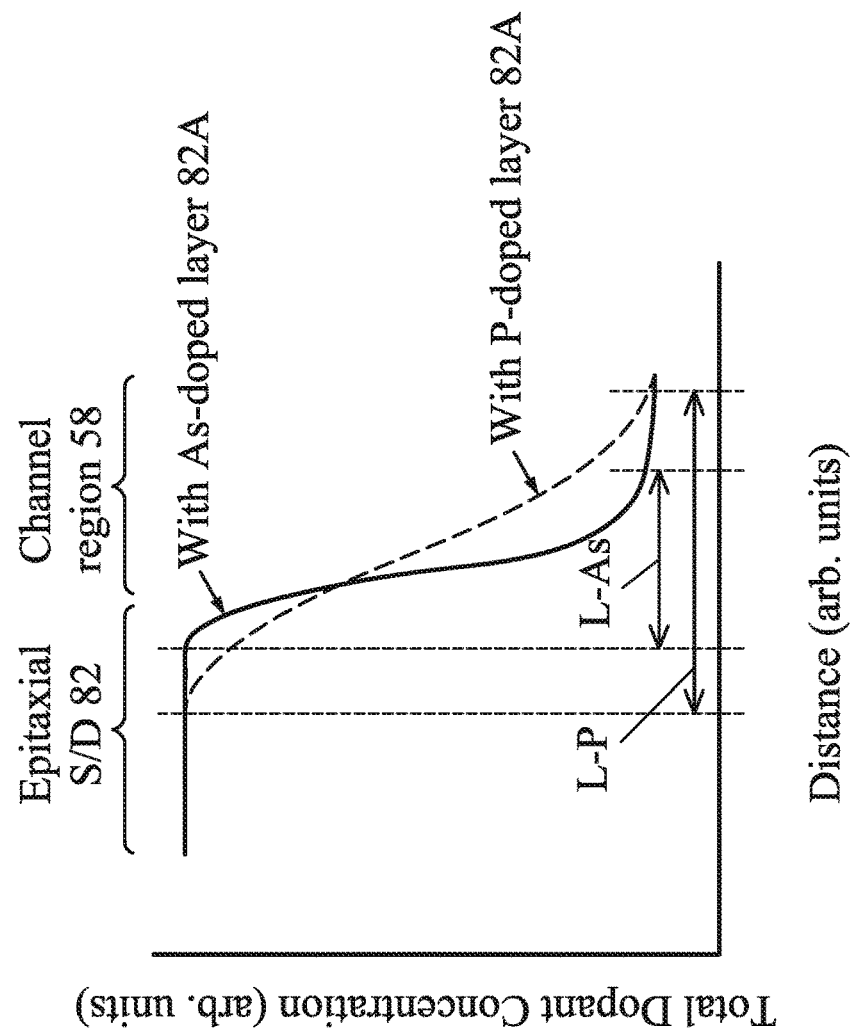
FIG. 14 is an illustration of example dopant profiles of an epitaxial source/drain region of a FinFET, in accordance with some embodiments.

As an illustrative example, FIG. 14 shows the total n-type doping concentrations (e.g., both phosphorus and arsenic) at an interface between epitaxial source/drain regions 82 and channel regions 58. FIG. 14 illustrates the concentration for an epitaxial source/drain region 82 having an arsenic-doped first epitaxial layer 82A and the concentration for an epitaxial source/drain region 82 having a phosphorus-doped first epitaxial layer 82A. The Y-axis is the total doping n-type concentration (logarithmic, arbitrary units) and the X-axis is distance (arbitrary units). In both examples, the second epitaxial layer 82B is phosphorus-doped. As shown in FIG. 14, the epitaxial source/drain region 82 with an arsenic-doped first epitaxial layer 82A has a doping transition length ("L-As") that is shorter than the doping transition length ("L-P") of the epitaxial source/drain region 82 with a phosphorus-doped first epitaxial layer 82A. The concentrations and distances shown in FIG. 14 are approximate and intended to be illustrative. In some embodiments, the doping transition length of an epitaxial source/drain region 82 with an arsenic-doped first epitaxial layer 82A may be between about 7 nm and about 15 nm, where the dopant transition length is defined as the distance from the interface between epitaxial source/drain regions 82 and channel regions 58 to the position at which the total dopant concentration is lower than $1 \times 10^{18}$ atom/cm$^3$. In some cases, an epitaxial source/drain region 82 with an arsenic-doped first epitaxial layer 82A may have a doping transition length that is between about 30% and about 80% of than the doping transition length of an epitaxial source/drain region 82 without an arsenic-doped first epitaxial layer 82A.

Figure 15:
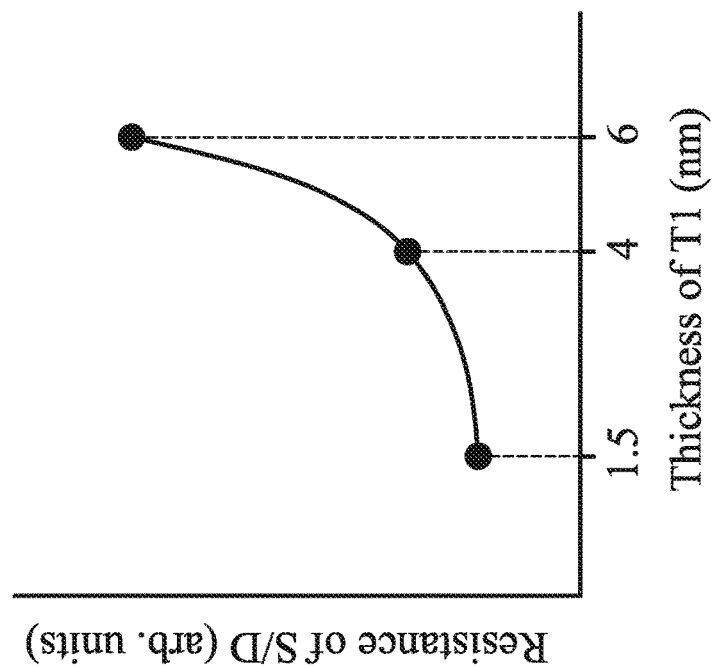
FIG. 15 is an illustration of resistances of an epitaxial source/drain region of a FinFET, in accordance with some embodiments.

Because the mobility of arsenic is less than the mobility of phosphorus, the resistivity of an arsenic-doped layer (e.g., the first epitaxial layer 82A) may be greater than the resistivity of a phosphorus-doped layer (e.g., the second epitaxial layer 82B). Thus, an epitaxial source/drain region 82 having a thicker arsenic-doped first epitaxial layer 82A may have a larger resistance (e.g., "Repi"). As an illustrative example, FIG. 15 shows the resistance of an epitaxial source/drain region 82 for different values of thickness T1. As shown in FIG. 15, an arsenic-doped first epitaxial layer 82A with a smaller thickness T1 can reduce the resistance of the epitaxial source/drain region 82. In this manner, a particular thickness T1 may be used for a particular application to control the desired resistance, doping transition length, and doping concentration of the epitaxial source/drain region 82. A thinner arsenic-doped first epitaxial layer 82A can thus allow for reduced DIBL effects without significantly increasing the resistance of the epitaxial source/drain region 82.

Epitaxial source/drain regions 84 (shown in FIGS. 16A-B) in the p-type region 50P may be formed by masking the n-type region 50N and etching source/drain regions of the fins 52 in the p-type region 50P to form recesses in the fins 52. Then, the epitaxial source/drain regions 84 in the p-type region 50P are epitaxially grown in the recesses. The epitaxial source/drain regions 84 may include any acceptable material, such as appropriate for p-type FinFETs. For example, if the fin 52 is silicon, the epitaxial source/drain regions 84 in the p-type region 50P may comprise materials exerting a compressive strain in the channel region 58, such as silicon-germanium, boron doped silicon-germanium, germanium, germanium tin, or the like. The epitaxial source/drain regions 84 in the p-type region 50P may have surfaces raised from respective surfaces of the fins 52 and may have facets.

The epitaxial source/drain regions 84 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 84 may be in situ doped during growth.

As a result of the epitaxy processes used to form the epitaxial source/drain regions 82 in the n-type region 50N and the epitaxial source/drain regions 84 in the p-type region 50P, upper surfaces of the epitaxial source/drain regions have facets which expand laterally outward beyond sidewalls of the fins 52. In some embodiments, these facets cause adjacent source/drain regions 82/84 of a same FinFET to merge as illustrated by FIG. 16A. In other embodiments, adjacent source/drain regions 82/84 remain separated after the epitaxy process is completed as illustrated by FIG. 16B. In the embodiments illustrated in FIGS. 16A and 16B, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 17B:
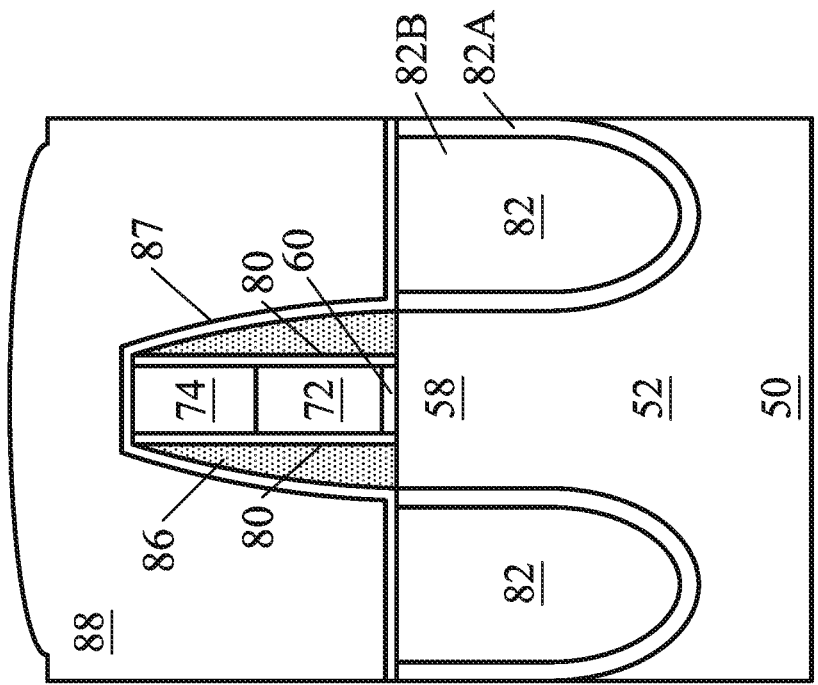
Figure 17A:
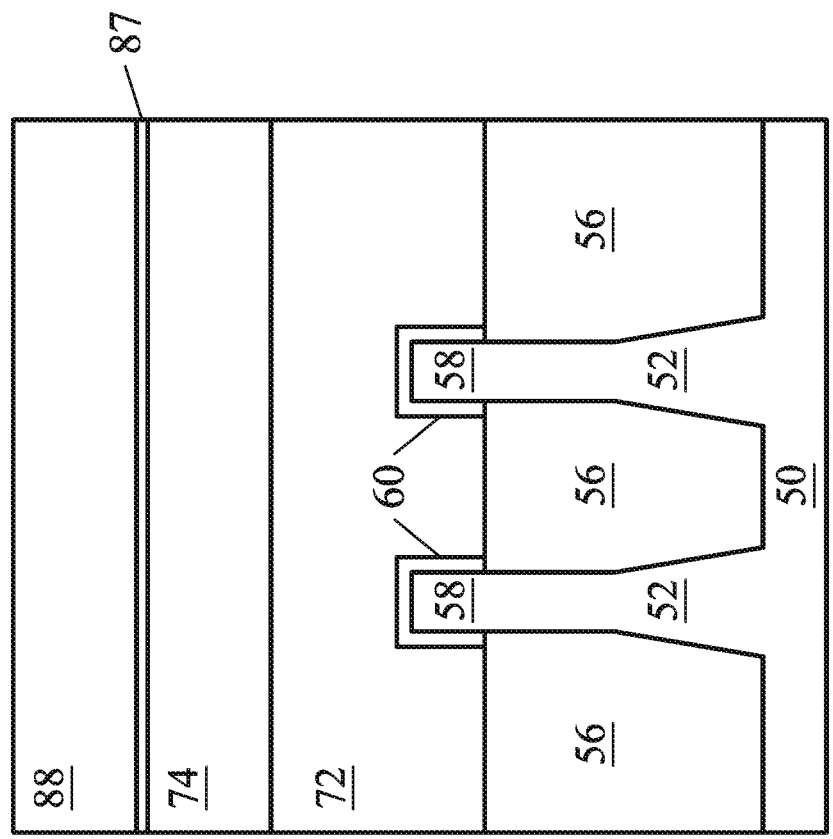

In FIGS. 17A and 17B, a first interlayer dielectric (ILD) 88 is deposited over the structure illustrated in FIG. 12. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18B:
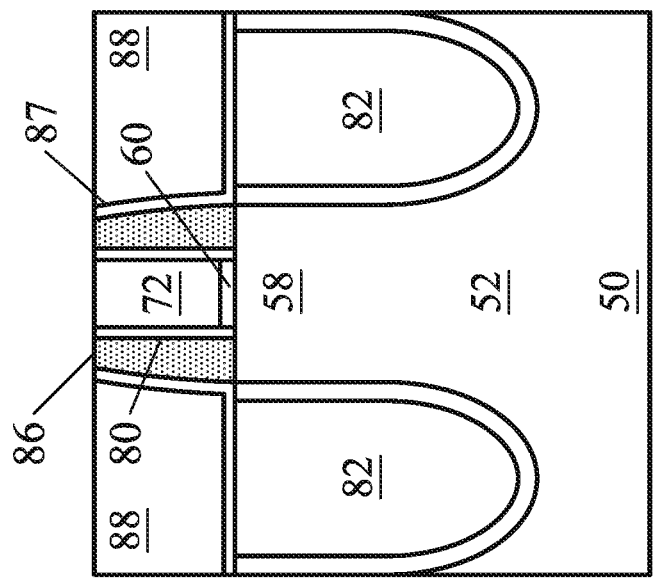
Figure 18A:
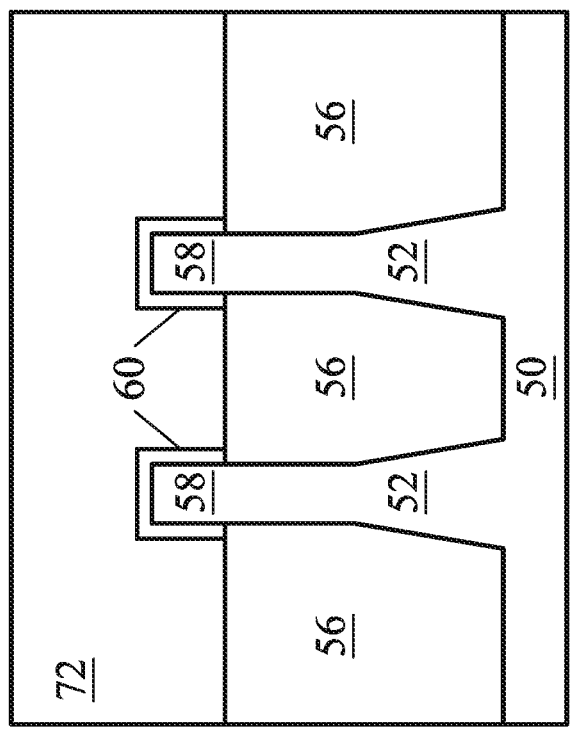

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 19B:
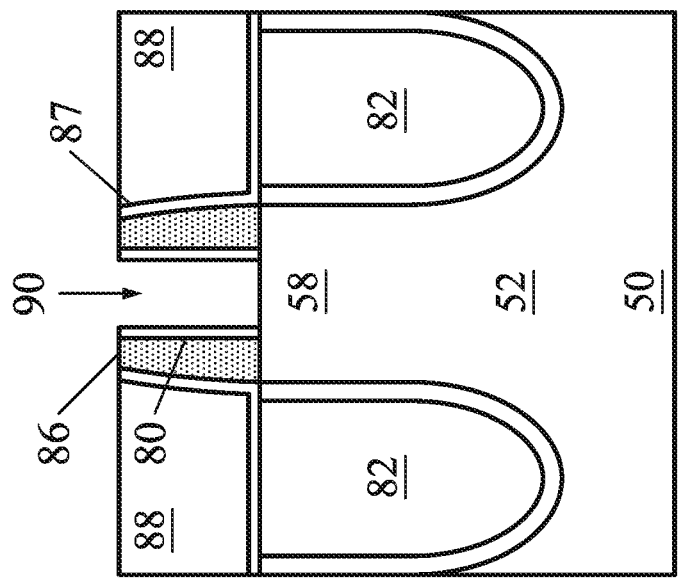
Figure 19A:
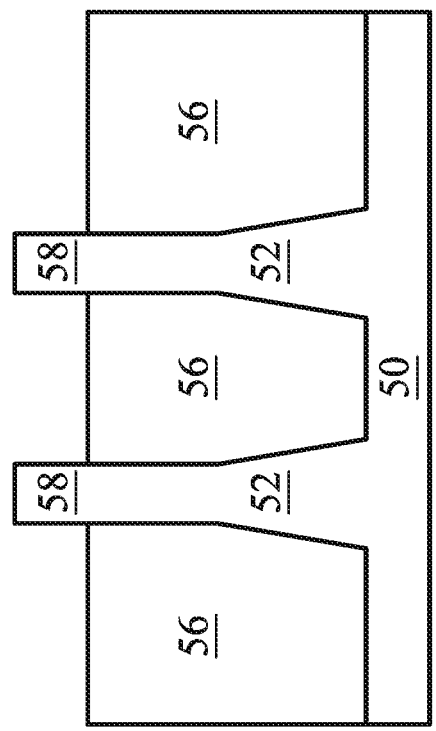

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
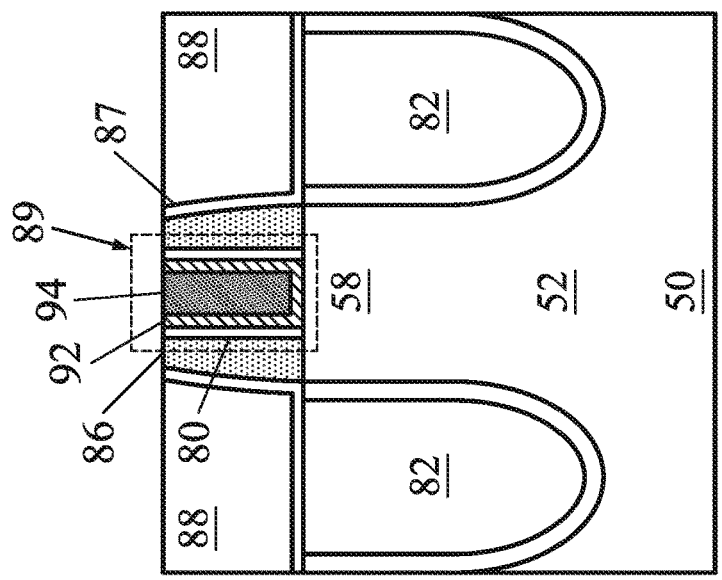
Figure 20A:
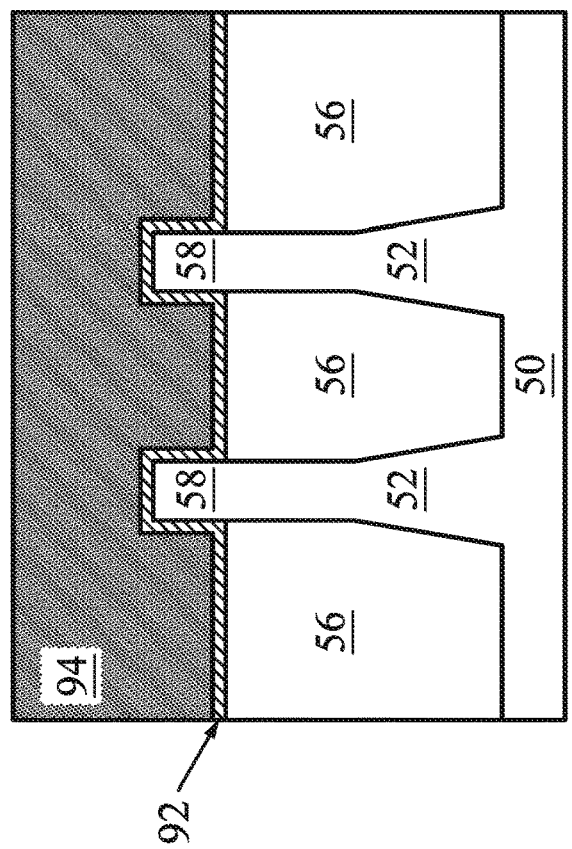
Figure 20C:
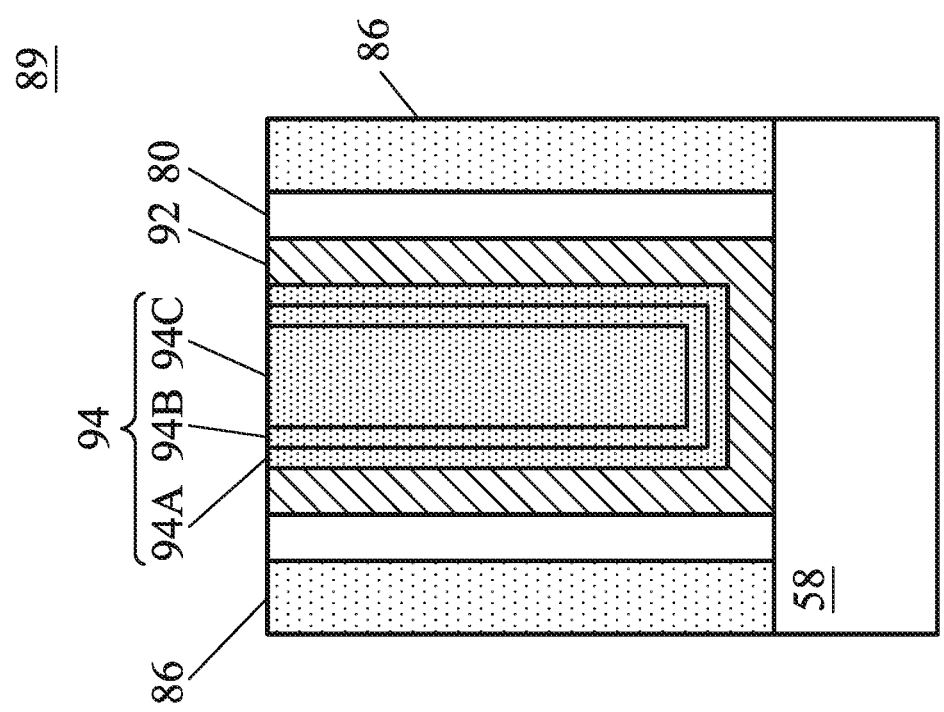

In FIGS. 20A and 20B, gate dielectric layers 92 and gate electrodes 94 are formed for replacement gates. FIG. 20C illustrates a detailed view of region 89 of FIG. 20B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
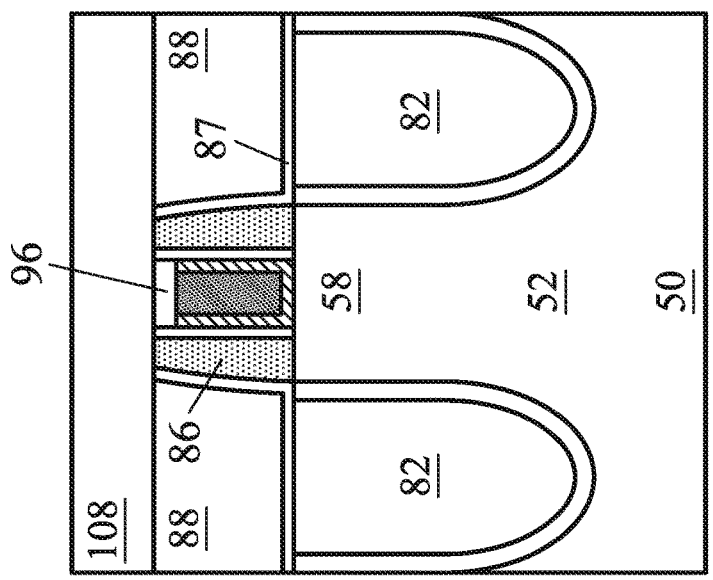
Figure 21A:
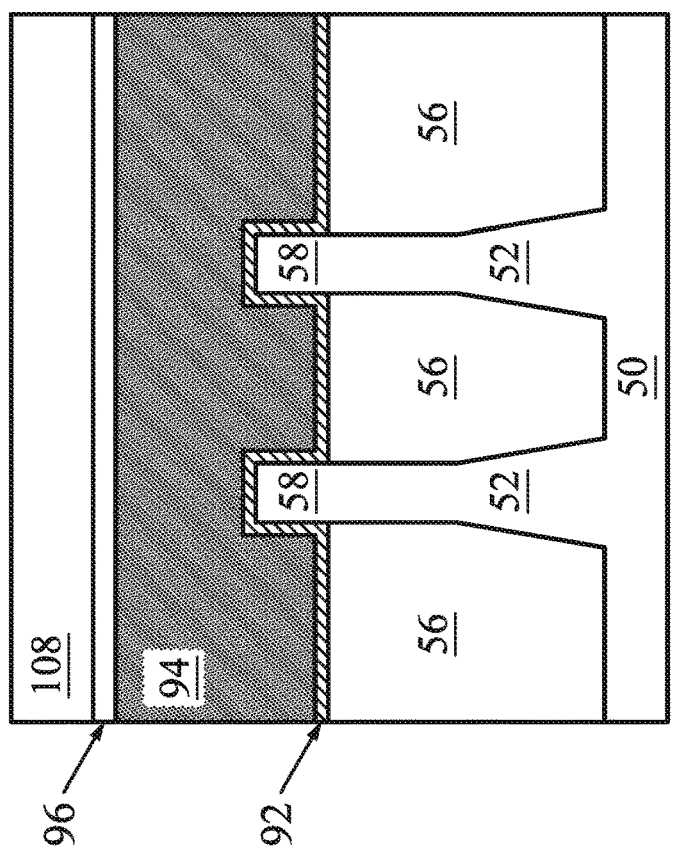

In FIGS. 21A and 21B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 22A and 22B) penetrate through the second ILD 108 and the gate mask 96 to contact the top surface of the recessed gate electrode 94.

Figure 22B:
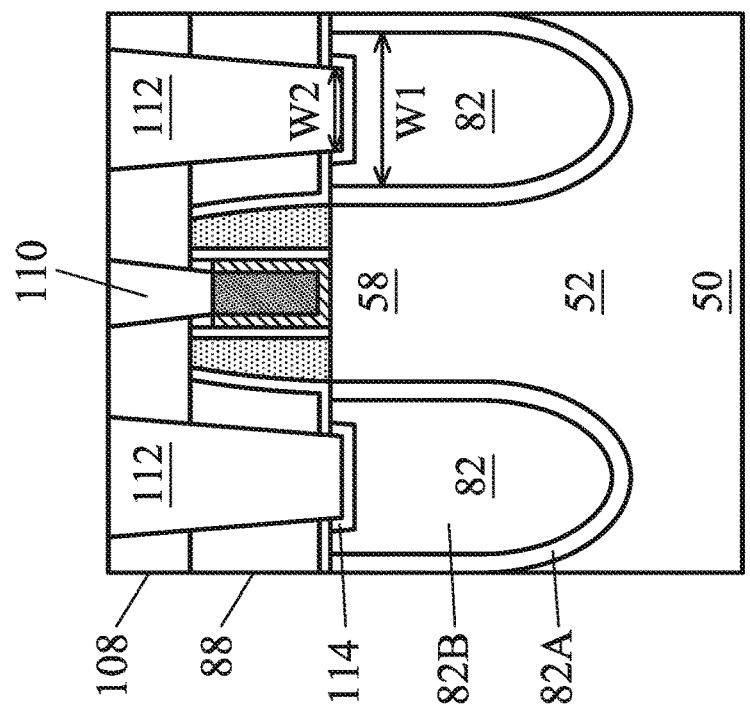
Figure 22A:
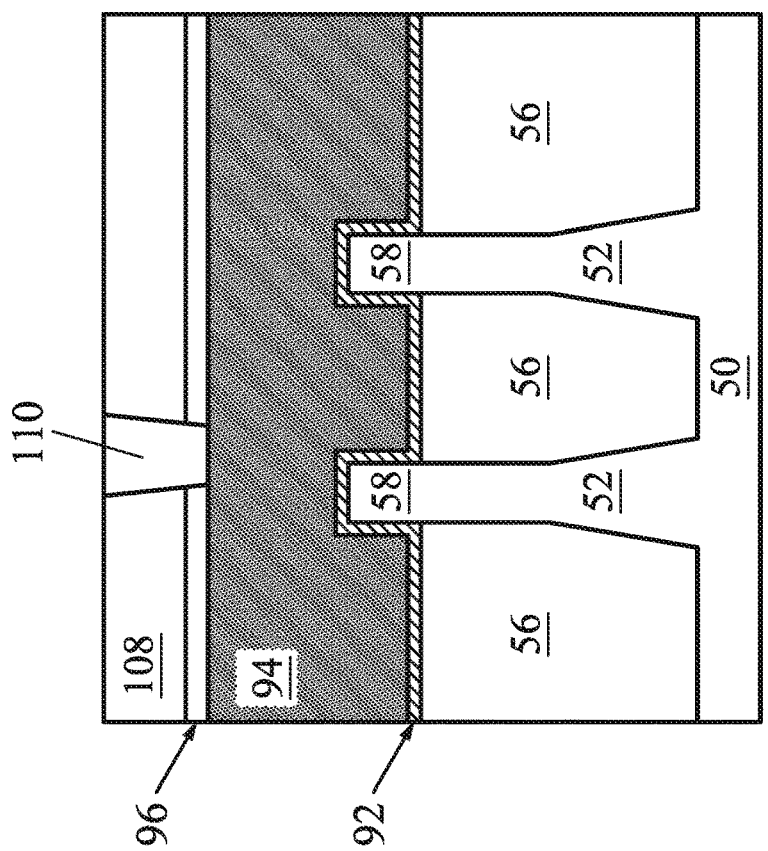

In FIGS. 22A and 22B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide 114 at the interface between the epitaxial source/drain regions 82/84 and the source/drain contacts 112. The source/drain contacts 112 are physically and electrically coupled to the epitaxial source/drain regions 82/84, and the gate contacts no are physically and electrically coupled to the gate electrodes 94. In some embodiments, the source/drain contacts 112 may extend into the epitaxial source/drain regions 82/84, as shown in FIG. 22B. The source/drain contacts 112 and gate contacts no may be formed in different processes, or may be formed in the same process. Although shown as being formed in the same cross-sections, it should be appreciated that each of the source/drain contacts 112 and gate contacts no may be formed in different cross-sections, which may avoid shorting of the contacts.

As discussed previously, a phosphorus-doped second epitaxial layer 82B may have a smaller resistivity than an arsenic-doped first epitaxial layer 82A. Thus, forming the source/drain contacts 112 that are only physically and electrically coupled to the second epitaxial layer 82B can reduce the resistance of the junction between the source/drain contacts 112 and the epitaxial source/drain regions 82. For example, in some embodiments, the source/drain contacts 112 may be formed having a width W2 that is about the same as or less than an upper width W1 of the second epitaxial layer 82B. In some embodiments, an second epitaxial layer 82B may have an upper width W1 that is between about 15 nm and about 50 nm, or a source/drain contact 112 may have a width W2 that is between about 6 nm and about 40 nm. In some embodiments, a source/drain contact 112 may have a width W2 that is between about 40% and about 100% of the upper width W1 of the second epitaxial layer 82B. These are examples, and other widths are possible.

Various embodiments discussed herein have advantages. By forming epitaxial source/drain regions in an n-type FinFET transistor with an arsenic-doped epitaxial layer, diffusion of dopants into the channel regions can be reduced. The arsenic-doped epitaxial layer can also allow for a shorter doping transition between the epitaxial source/drain regions and the channel regions, which can reduce DIBL and improve performance. Additionally, a thin arsenic-doped epitaxial layer can provide these advantages without significantly increasing the resistance of the epitaxial source/drain region.

In accordance with an embodiment, a device includes a fin extending from a substrate; a gate stack over and along sidewalls of the fin; a gate spacer along a sidewall of the gate stack; an epitaxial source/drain region in the fin and adjacent the gate spacer, the epitaxial source/drain region including a first epitaxial layer on the fin, the first epitaxial layer including silicon and arsenic; and a second epitaxial layer on the first epitaxial layer, the second epitaxial layer including silicon and phosphorus, the first epitaxial layer separating the second epitaxial layer from the fin; and a contact plug on the second epitaxial layer. In an embodiment, the first epitaxial layer extends along sidewalls of the second epitaxial layer. In an embodiment, a vertical distance between a top surface of the fin and a bottom surface of the second epitaxial layer is in a range of 20 nm to 100 nm. In an embodiment, a thickness of the first epitaxial layer on a sidewall of the second epitaxial layer is in a range of 1 nm to 6 nm. In an embodiment, the thickness of the first epitaxial layer is measured at a midpoint between a top surface of the fin and a bottom surface of the second epitaxial layer. In an embodiment, the second epitaxial layer has a first lateral width, and wherein the contact plug has a second lateral width that is less than the first lateral width. In an embodiment, the contact plug is laterally separated from the first epitaxial layer. In an embodiment, the device includes a silicide between the contact plug and the second epitaxial layer. In an embodiment, a concentration of arsenic in the first epitaxial layer is less than a concentration of phosphorus in the second epitaxial layer.

In accordance with an embodiment, a semiconductor device includes a fin over a semiconductor substrate, the fin including a channel region; an isolation region surrounding the fin; a gate structure extending over the channel region of the fin and along sidewalls of the fin; and a source/drain region adjacent the channel region, the source/drain region including a first epitaxial region adjacent the channel region, wherein the first epitaxial region is doped with a first n-type dopant; and a second epitaxial region on the first epitaxial region, wherein the second epitaxial region is doped with a second n-type dopant that is different from the first n-type dopant. In an embodiment, the first epitaxial region has a thickness less than 6 nm. In an embodiment, the first n-type dopant is arsenic, and a concentration of the first n-type dopant is in the range of 1E20 $cm^{-3}$ to 2E21 $cm^{-3}$. In an embodiment, the second n-type dopant is phosphorus, and a concentration of the second n-type dopant is in the range of 5E20 $cm^{-3}$ to 5E21 $cm^{-3}$. In an embodiment, the source/drain region has a doping transition length in the range between 7 nm and 15 nm, wherein the dopant transition length is defined as the distance from the interface between the source/drain region and the channel region to the position at which the total dopant concentration is lower than 1E10$^{18}$ atom/$cm^3$. In an embodiment, the first epitaxial region has a greater resistance than the second epitaxial region. In an embodiment, a portion of the first epitaxial region is free of the second n-type dopant.

In accordance with an embodiment, a method includes depositing a dummy gate over and along sidewalls of a fin extending upwards from a substrate; forming a gate spacer along a sidewall of the dummy gate; forming a recess in the fin adjacent the gate spacer; and forming a source/drain region in the recess, the forming of the source/drain region including epitaxially growing a first doped silicon layer lining the recess, wherein the first doped silicon layer is doped with arsenic; and epitaxially growing a second doped silicon layer on the first doped silicon layer, wherein the second doped silicon layer is doped with phosphorus. In an embodiment, epitaxially growing the first doped silicon layer includes using a first chemical vapor deposition (CVD) process, and wherein epitaxially growing the second doped silicon layer includes using a second CVD process. In an embodiment, the first doped silicon layer is epitaxially grown to a thickness in the range from 1 nm to 6 nm. In an embodiment, the method includes forming a conductive feature on the second doped silicon layer, and wherein a portion of the second doped silicon layer is free of arsenic.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin extending from a substrate, the fin comprising a recess;
   a gate stack over and along sidewalls of the fin, wherein the gate stack is adjacent the recess;
   a gate spacer along a sidewall of the gate stack;
   an epitaxial source/drain region in the recess and adjacent the gate spacer, the epitaxial source/drain region comprising:
      a first epitaxial layer on the fin within the recess, the first epitaxial layer comprising silicon and arsenic, wherein portions of the first epitaxial layer near the top of the recess have a first thickness, wherein portions of the first epitaxial layer near the bottom of the recess have a second thickness that is greater than the first thickness, wherein portions of the first epitaxial layer at locations halfway between the top of the recess and the bottom of the recess have the first thickness; and
      a second epitaxial layer on the first epitaxial layer, the second epitaxial layer comprising silicon and phosphorus, the first epitaxial layer separating the second epitaxial layer from the fin; and
   a contact plug on the second epitaxial layer.

2. The device of claim 1, wherein the first epitaxial layer extends along sidewalls of the second epitaxial layer.

3. The device of claim 1, wherein a vertical distance between a top surface of the fin and a bottom surface of the second epitaxial layer is in a range of 20 nm to 100 nm.

4. The device of claim 1, wherein the first thickness of the first epitaxial layer is in the range of 1 nm to 2 nm.

5. The device of claim 1, wherein the second epitaxial layer has a first lateral width, and wherein the contact plug has a second lateral width that is less than the first lateral width, wherein the contact plug is laterally separated from the first epitaxial layer.

6. The device of claim 1, wherein a concentration of arsenic in the first epitaxial layer is less than a concentration of phosphorus in the second epitaxial layer.

7. The device of claim 1, wherein the second thickness of the first epitaxial layer is in the range of 10 nm to 12 nm.

8. The device of claim 1, wherein the epitaxial source/drain region comprises an inner region that is doped with phosphorus and is arsenic-free, an outer region that is doped with arsenic and is phosphorus-free.

9. The device of claim 1, wherein a first region of the first epitaxial layer has a maximum concentration of arsenic, wherein a second region of the second epitaxial layer has a maximum concentration of phosphorus, wherein a middle region between the first region and the second region has a concentration of phosphorus that is less than the maximum concentration of phosphorus and a concentration of arsenic that is less than the maximum concentration of arsenic, wherein the second region has a nonzero concentration of arsenic.

10. A semiconductor device comprising:
    a fin over a semiconductor substrate, the fin comprising a channel region;
    an isolation region surrounding the fin;
    a gate structure extending over the channel region of the fin and along sidewalls of the fin; and
    a source/drain region adjacent the channel region, the source/drain region comprising:
       a first epitaxial region adjacent the channel region, wherein the first epitaxial region is doped with a first n-type dopant; and
       a second epitaxial region on the first epitaxial region, wherein the second epitaxial region is doped with a second n-type dopant that is different from the first n-type dopant;
       wherein the source/drain region has a doping transition length in the range of 7 nm to 15 nm, wherein the dopant transition length is defined as the distance from the interface between the source/drain region and the channel region to the position at which the total dopant concentration is lower than 1E18 cm$^{-3}$.

11. The semiconductor device of claim 10, wherein the first epitaxial region has a thickness less than 6 nm.

12. The semiconductor device of claim 10, wherein the first n-type dopant is arsenic, and wherein a concentration of the first n-type dopant is in the range of 1E20 cm$^{-3}$ to 2E21 cm$^{-3}$.

13. The semiconductor device of claim 10, wherein the second n-type dopant is phosphorus, and wherein a concentration of the second n-type dopant is in the range of 5E20 cm$^{-3}$ to 5E21 cm$^{-3}$.

14. The semiconductor device of claim 10, wherein the first epitaxial region has a greater resistance than the second epitaxial region.

15. The semiconductor device of claim 10, wherein a portion of the first epitaxial region is free of the second n-type dopant.

16. A device comprising:
    a fin protruding from a semiconductor substrate;
    a gate structure over sidewalls and a top surface of the fin;
    a gate spacer on the gate structure;
    an epitaxial source/drain structure in the fin and adjacent the gate spacer, wherein the epitaxial source/drain structure comprises an outer epitaxial region surrounding the sides and bottom of an inner epitaxial region, wherein the outer epitaxial region physically contacts a surface of the fin; wherein the outer epitaxial region is doped with arsenic, wherein the inner epitaxial region is free of arsenic, wherein the outer epitaxial region comprises a region of maximum arsenic concentration and a first region of submaximal arsenic concentration, wherein the region of maximum arsenic concentration is separated from the inner epitaxial region by the first region of submaximal arsenic concentration, wherein the region of maximum arsenic concentration is within 6 nm from the surface of the fin.

17. The device of claim 16, wherein the inner epitaxial region is doped with phosphorus.

18. The device of claim 17, wherein the concentration of phosphorus in the region of maximum arsenic concentration is less than the concentration of arsenic in the region of maximum arsenic concentration.

19. The device of claim 17, wherein the inner epitaxial region has a maximum concentration of phosphorus that is greater than the maximum concentration of arsenic in the outer epitaxial region.

20. The device of claim 16, wherein the outer epitaxial region further comprises a second region of submaximal arsenic concentration, wherein the region of maximum arsenic concentration is separated from the surface of the fin by the second region of submaximal arsenic concentration.

* * * * *